United States Patent [19]

Hull et al.

[11] Patent Number: 4,808,884
[45] Date of Patent: Feb. 28, 1989

[54] HIGH ORDER DIGITAL PHASE-LOCKED LOOP SYSTEM

[75] Inventors: Richard W. Hull, Laguna Hills, Calif.; Donald E. Tolsch, Albuquerque, N. Mex.; James H. P. Wang, Anaheim, Calif.

[73] Assignee: Western Digital Corporation, Irvine, Calif.

[21] Appl. No.: 803,664

[22] Filed: Dec. 2, 1985

[51] Int. Cl.⁴ .............................. H03D 3/24
[52] U.S. Cl. ........................ 375/120; 360/51; 307/269
[58] Field of Search ............ 375/82, 83, 80, 119, 375/120; 329/50, 122; 328/72, 74, 133; 331/1 A; 360/51, 77; 307/269

[56] References Cited

U.S. PATENT DOCUMENTS

| | | |
|---|---|---|
| 3,653,009 | 3/1972 | Krause . |
| 3,827,078 | 7/1974 | Bauer . |
| 4,005,479 | 1/1977 | Hunnicutt . |
| 4,059,805 | 11/1977 | de Laage de Meux ............... 329/50 |
| 4,121,172 | 10/1978 | Garde .................................. 331/1 A |
| 4,141,046 | 2/1979 | Brown ................................. 360/51 |
| 4,157,573 | 6/1979 | Aghazadeh ......................... 360/51 |
| 4,171,479 | 10/1979 | Rozsa .................................. 235/449 |
| 4,215,430 | 7/1980 | Johnson, Jr. ........................ 375/111 |
| 4,245,264 | 1/1981 | Allen .................................. 360/51 |
| 4,275,466 | 6/1981 | Yamamoto ........................... 375/113 |
| 4,281,356 | 7/1981 | Sousa .................................. 360/45 |
| 4,357,707 | 11/1982 | Delury ................................ 375/119 |
| 4,371,974 | 2/1983 | Dugan ................................. 375/82 |
| 4,380,815 | 4/1983 | Clendening .......................... 375/80 |
| 4,385,396 | 5/1983 | Norton ................................ 375/110 |
| 4,400,667 | 8/1983 | Belkin ................................. 371/1 A |
| 4,424,497 | 1/1984 | Fellinger ............................. 331/1 A |
| 4,472,686 | 9/1984 | Nishimura et al. .................. 375/120 |
| 4,534,044 | 8/1985 | Funke et al. ........................ 360/51 |
| 4,535,459 | 8/1985 | Hogge, Jr. .......................... 328/133 |
| 4,542,351 | 9/1985 | Okada ................................. 375/120 |

FOREIGN PATENT DOCUMENTS

| | | |
|---|---|---|
| 0157053 | 12/1984 | European Pat. Off. . |
| 2080658A | 2/1982 | United Kingdom . |
| 2112235A | 7/1983 | United Kingdom . |

Primary Examiner—Robert L. Griffin
Assistant Examiner—Stephen Chin
Attorney, Agent, or Firm—Spensley Horn Jubas & Lubitz

[57] ABSTRACT

A digital data separator operates to separate data pulses from clock pulses in MFM encoded signals read from a magnetic disk system. The data separator includes a digital phase-locked loop system incorporating a variable length shift register which functions as a variable oscillator and programmed state machines which control the operation of the shift register and provides filtering functions. The state machines filter high frequency noise components from the incoming data signals and enables the system to accurately track frequency variations in the data stream while providing high tolerance to high frequency noise.

18 Claims, 11 Drawing Sheets

U.S. Patent  Feb. 28, 1989  Sheet 1 of 11  4,808,884
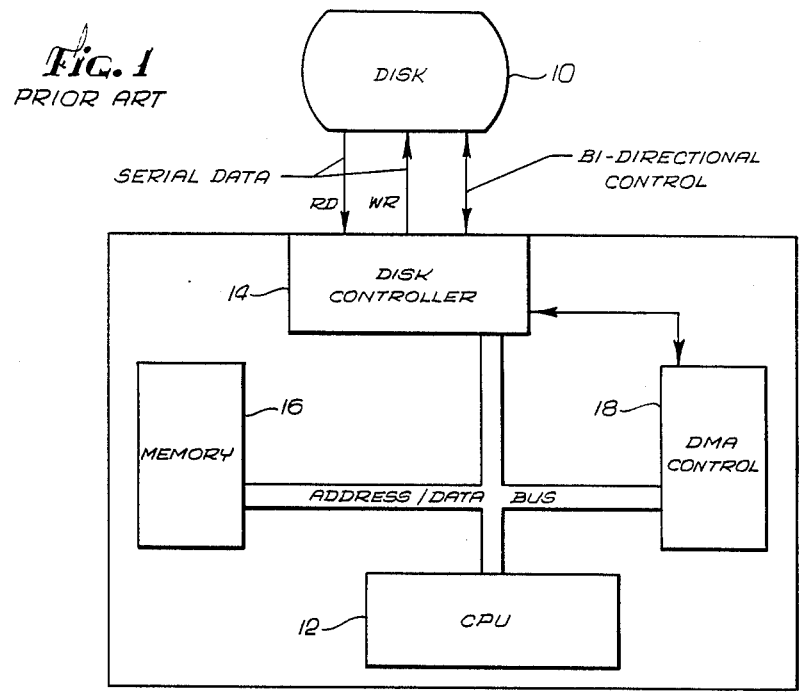
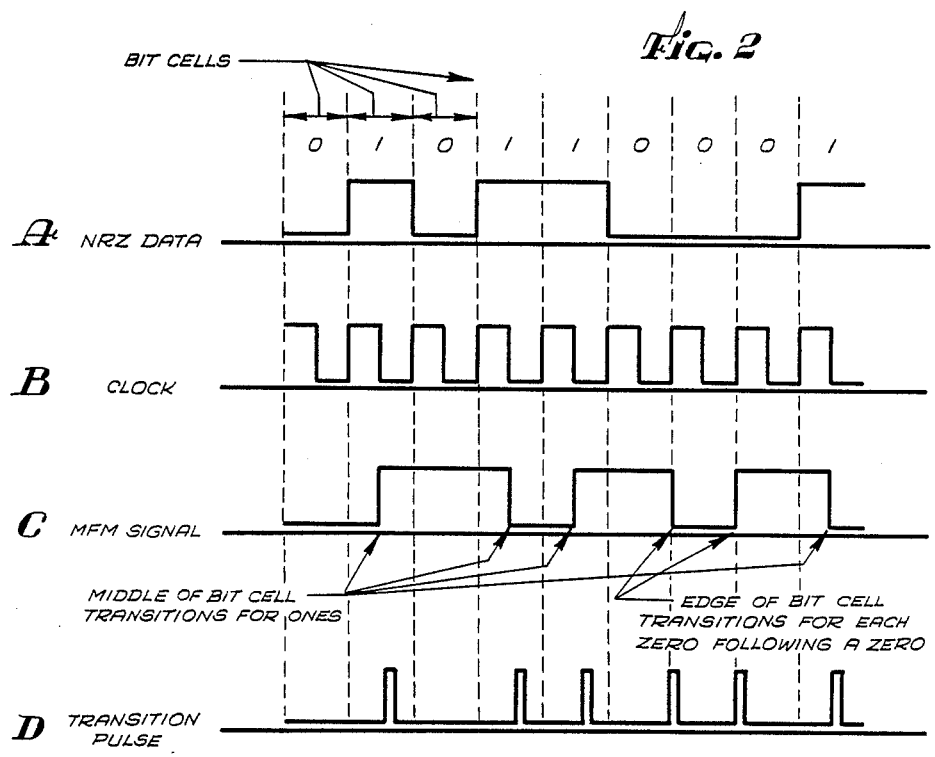

A. C = CLOCK
B. W = WINDOW (DELAYED CLOCK)
C. T = TRANSITION PULSES
D. E = EXTENSION SIGNAL
E. NRZ DATA (DELAYED)

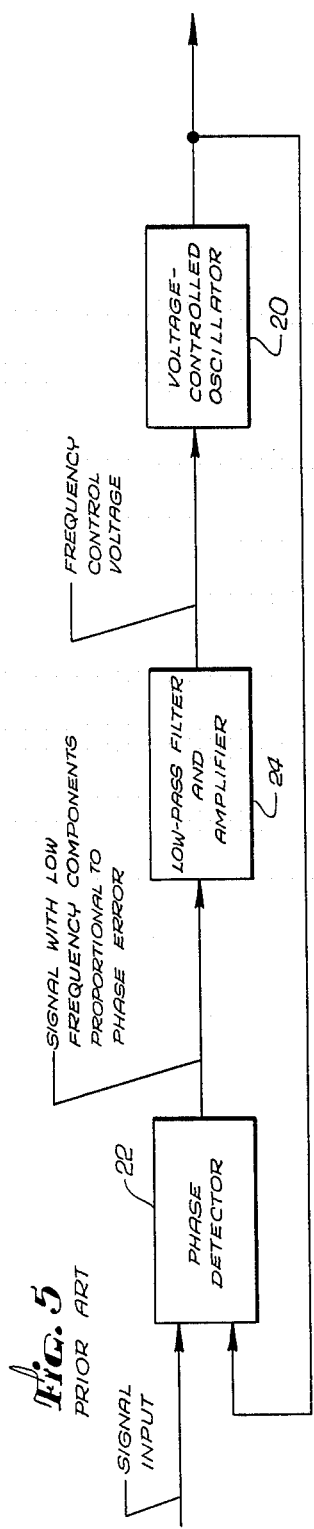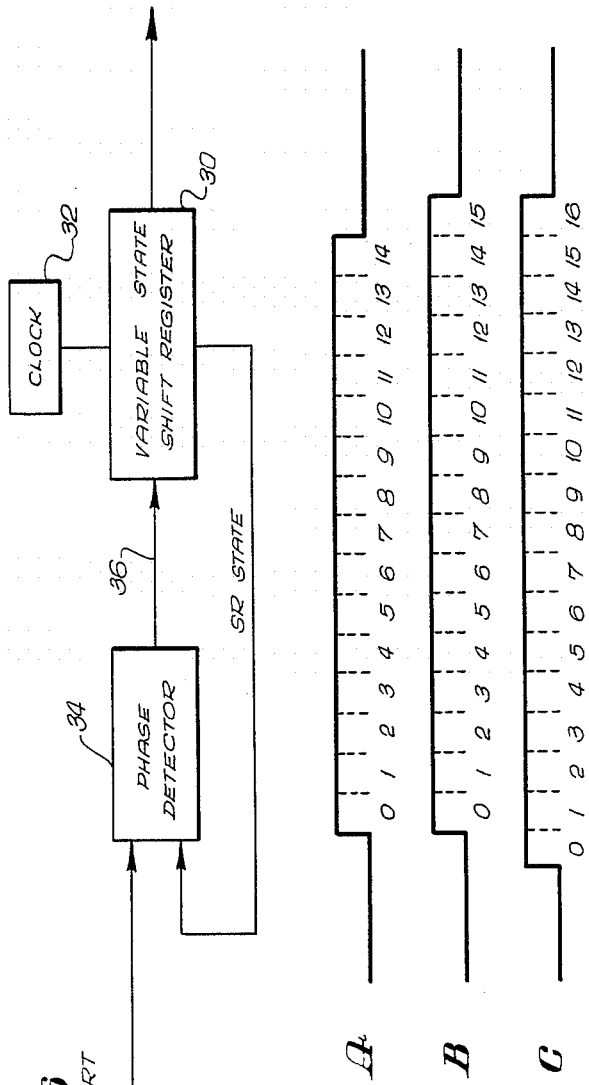
Fig. 5 PRIOR ART
Fig. 6 PRIOR ART
Fig. 7

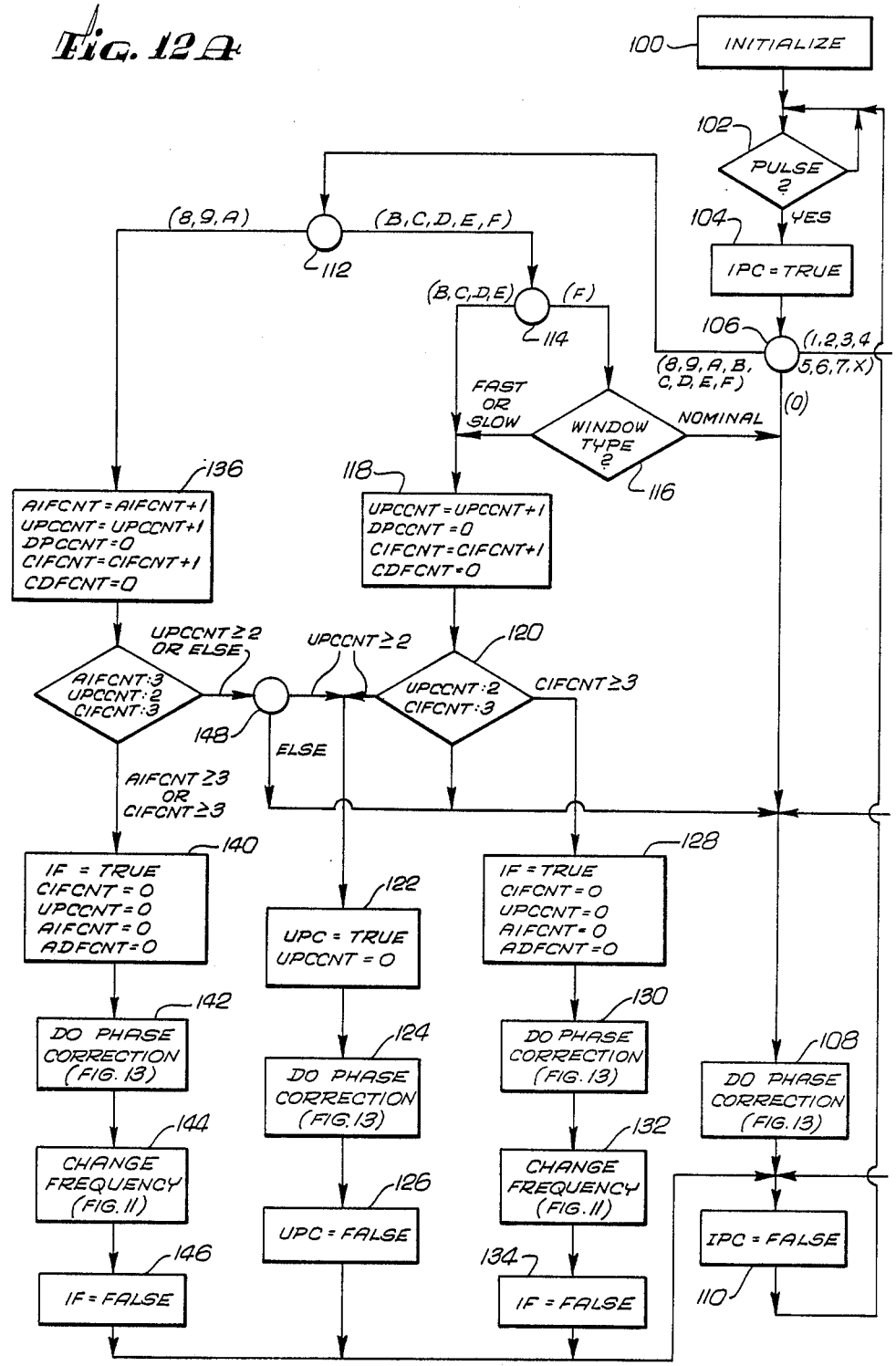

NOMINAL WINDOW

FAST WINDOW

SLOW WINDOW

NUMBER OF
TRANSITION
PULSES

LOCATION IN WINDOW

NUMBER OF
TRANSITION
PULSES

EDGE REGION    EDGE REGION

LOCATION IN WINDOW

HIGH ORDER DIGITAL PHASE-LOCKED LOOP SYSTEM

BACKGROUND OF THE INVENTION

1. Field of the Invention

The present invention relates to phase-locked loop systems and more particularly to digital phase-locked loop systems. Phase-locked loops are employed to generate a clock signal which is frequency and/or phase referenced to an external input signal. Phase-locked loop systems are used in many fields of communications, and are also employed in computer applications for data synchronization from peripheral sources. The present invention is particularly directed to the use of phase-locked loops for data separation in disk drive systems when reading data information which is interspersed with clock information.

FIG. 1 illustrates a typical computing system in which data is transmitted between a memory disk system 10 and a central processing unit (CPU) 12. A disk controller 14 is responsible for executing CPU initiated commands to the disk drive electronics. This includes writing properly formatted serial data to the disk and accurately recovering data from the disk. The computing system also typically includes an internal memory 16 and a direct memory access (DMA) control 18.

Data written onto a disk consists of logic ones and zeros which are written at a particular data, or bit cell, rate. In order to accurately read the data from the disk, the data rate of the signal being read must be known. This is facilitated by encoding the data which is written onto the disk so that the signals include clock information as well as data information. The embedded clock information is then employed to determine the data rate when signals from the disk are being read.

Data is most commonly encoded on a disk in modified frequency modulation (MFM) format. MFM is a digital signal, derived from the original non-return-to-zero (NRZ) data stream and a synchronous clock signal. The rules of MFM encoding are that each NRZ logic one causes a transition in the MFM signal at the center of the bit cell, and if an NRZ logic zero follows a logic one, the state of the MFM signal does not change. If a logic zero follows another logic zero, there is an MFM transition at the boundary between the two bit cells. An example of MFM coding is shown in FIG. 2. The NRZ data shown in FIG. 2A is comprised of a series of ones and zeros, each occupying a bit cell. A clock signal indicated in FIG. 2B defines the bit cells. The MFM signal shown in FIG. 2C may be generated from the NRZ data and clock signals by exclusive-oring the data and clock to form a phase encoded signal, and then dividing the number of transitions by two with a toggle flip-flop. It is only the MFM transitions, not their senses, that are essential to decoding. Typically, disk read electronics are employed so that the signal recovered from a disk is in the form of a narrow pulse for each MFM transition, as shown in FIG. 2D.

NRZ data may be recovered from MFM transitions as shown in FIG. 3. A window signal W, which is a delayed clock C, is generated and used to distinguish center-of-bit-cell (data) from boundary-of-bit-cell (clock) pulses. Each transition pulse T that occurs during the window latches a window extension signal E until the positive clock transition at the end of the bit cell. When E is high at the end of the window (negative transition of W) the NRZ data is a logic one; when E is low at that time, the NRZ data is a logic zero.

Ideally, the clock rate of data read from the disk is a known fixed value. Due to various factors, however, such is not the case, and the clock rate of the data must be determined by looking at the data itself and generating the clock and window signals at the appropriate frequency to track the data. The clock signal is recovered from the MFM data using a phase-locked loop driven by the transition pulses. The function of the phase-locked loop is to provide clock signals which are equal to the clock rate of the data being read. Although the clock rate has a known ideal value, the actual clock rate of the data will vary from the ideal due to several factors. These factors include variations in the speed that the data track moves past the read head of the disk drive, including both long-term and short-term disk speed variations, examples of which are eccentricity and warping of the circular data tracks. The purpose of the phase-locked loop is to generate clock signals which follow such data rate variations.

In addition to variations in the actual data rate, the timing of MFM pulses read from a disk deviate from the ideal due to high frequency noise at the read head from external sources and adjacent tracks and noise in the read electronics, and due to "peak shift", i.e., a shifting of bit position due to the magnetic field of adjacent bits of opposite polarity. The noise and peak shift results in random bit jitter (movement of transition pulses from their ideal positions) which is unrelated to variations in the data rate. Since the clock is recovered by reading the MFM pulses, the bit jitter can adversely affect the recovery of the clock signals.

2. Description of the Prior Art

To recover the original NRZ data and clock, a phase-locked loop (FIG. 4), driven by the transition pulses, reconstructs the clock signal, and the recovered clock and transition pulses are then decoded to give NRZ data. Typically, the clock signals are delayed a quarter of the clock period, and the delayed signal is used as a window to distinguish transitions occurring near the center of a bit cell from those occurring near the edge of each bit cell. Since only MFM transitions are available, the clock and data regions of the window signal (FIG. 8) cannot be uniquely identified with respect to the data stream. In practice MFM decoding is done using both signals as windows and the detection of a unique code is employed to determine which is the correct decoded MFM signal.

Ideally, each transition will occur precisely in the middle of the window signal. This will not always be the case, however, because of low frequency data rate variations which are not precisely tracked by the phase-locked loop and because of high frequency bit jitter. If the transition moves outside of the limits of the window, a read error will result. In order to accurately track the data rate of the MFM data transitions, the shift in the position of the transitions as a result of bit jitter should be ignored, whereas the shift in positions of the transitions as a result of change in the frequency of the data should be used to correct the frequency of the recovered clock and resultant window.

The most common prior art systems employ an analog phase-locked loop which incorporates low pass filtering in order to eliminate the effects of bit jitter on the generation of the recovered clock. Such a system is illustrated in FIG. 5. A voltage controlled oscillator (VCO) 20 is employed to generate the clock signals.

The output of the VCO is applied to a phase detector 22, where its phase is compared to the phase of the input signal (transition pulses). The output of the phase detector 22 is a signal with low frequency components proportional to the phase error and high frequency components resulting from bit jitter. This signal is applied to a low pass filter and amplifier 24 which attenuates the high frequency components resulting from bit jitter. The output of the filter and amplifier is a control voltage which is applied to the VCO 20 to control its output frequency.

Although the analog phase-locked loop circuit of FIG. 5 generally has good performance, it has several disadvantages. Such analog circuits are difficult to design and build and require a large amount of circuit board space. Additionally, they require adjustments to properly align the circuits in the system, i.e., to adjust the VCO frequency and gains and currents of various components. These adjustments are expensive in terms of production costs since they result in lower throughput and require technician overhead during controller board manufacturing.

Digital phase-locked loop systems have been designed in the past. A typical system is illustrated in FIG. 6. In such systems, a variable multiple state component such as a counter or shift register 30 performs a function analogous to the VCO of the analog phase-locked loop. The shift register is driven by a sample clock 32. The carry output of the shift register provides an output signal of variable frequency which is used to toggle the recovered clock window signal. The output frequency of the shift register is varied by adding or subtracting states, as illustrated in FIG. 7. For example, the shift register 30 may have sixteen nominal states, as illustrated in FIG. 7B. In order to reduce the frequency of the window signal, one state is added, as illustrated in FIG. 7C, and in order to increase the frequency of the window signal, one state is subtracted, as illustrated in FIG. 7A.

A phase detector 34 is implemented with a microprocessor or logic array and determines when the transition pulses arrive with respect to the states of the shift register. The logic array incorporates an algorithm to determine frequency corrections as a function of the determination of the state of occurrence of the transition pulses. If a transition pulse does not arrive in the correct state, the phase detector provides an error signal on line 36 to alter the number of states, and thus the output frequency, of the shift register 30. Some prior art systems make only instantaneous corrections in the number of states per window as a function of the arrival of a transition pulse in that particular window. Other systems make both instantaneous corrections to a window based upon the occurrence of a transition pulse in that particular window as well as making long-term corrections based upon the occurrence of transition pulses with respect to previous windows.

The primary disadvantage of prior digital phase-locked loops is that they are first order, i.e., they do not incorporate the concept of a filter. As a result, bit jitter adversely affects the operation of the phase-locked loop. This is to be contrasted with higher order analog phase-locked loop systems in which the bit jitter is filtered out and does not affect the frequency tracking operation of the system. Since they are only first order, prior art digital phase-locked loops used for disk data separators have very low performance, i.e., high data recovery error rates.

A more complex digital phase-locked loop system is shown in U.S. Pat. No. 4,357,707 to Delury. In the system disclosed in this patent, adjustments in the length of each window are made in accordance with the arrival location of the current data pulse and immediately preceding data pulse. These adjustments are provided to correct the phase of the generated window signal with respect to the incoming data. In addition, adjustments are made to the nominal frequency of the window signal in order to track frequency variations in the data. Frequency changes are made when two consecutive data pulses arrive in a predetermined error region. Although this system provides advantages over simpler digital phase-locked loop systems, its performance still falls short of analog phase-locked loop systems.

SUMMARY OF THE INVENTION

The present invention is directed to a digital phase-locked loop system which achieves true second order and higher performance. When implemented as part of a disk data separator, the system operates to effectively ignore bit jitter and track true frequency variations in the data stream. In the present embodiment of the invention, phase detection and error amplification is provided by programmed state machines which drive a digital controlled oscillator including a variable state shift register to change the frequency of the shift register output if appropriate. Filter operation is provided by latching state machine output terms and feeding them back at later clock times. By providing a system in which shifts in the occurrence of transition pulses due to bit jitter are ignored in generating the window signal, very accurate data separation is achieved, i.e., read errors are minimized.

The digital controlled oscillator is alterable to provide one of a plurality of preset output frequencies. This is accomplished by controlling the number of states in the shift register for each window signal. Frequency and phase tracking is accomplished by monitoring the arrival of each data pulse with respect to its corresponding window and making changes in the length of an individual window and/or the preset frequency. In order to ensure that all frequency changes are being made in the proper direction, they are not made until the position of at least three consecutive data pulses with respect to their corresponding windows indicate that a change in frequency should be made. Instantaneous corrections to the length of an individual window are made both as a function of the position of a data pulse occurring within that window and as a function of the position of one or more previous data pulses. These instantaneous changes serve to correct large phase errors and to correct phase errors resulting from delays in making frequency alterations. The operation of the system is completely symmetrical to ensure linear filter operation.

BRIEF DESCRIPTION OF THE DRAWINGS

The invention will be described with reference to the accompanying drawings, wherein:

FIG. 1 is a block diagram of a typical disk drive/CPU system;

FIG. 2 are waveforms A-D illustrating MFM encoded signals;

FIG. 5 is a block diagram of a PLL circuit arrangement;

FIG. 6 is a block diagram of a digital PLL arrangement;

FIG. 7 are waveforms A–C of 15, 16 and 17-state windows of the shift register of FIG. 6;

FIGS. 12A and 12B form a flow chart for the frequency tracking and correction state machine;

DESCRIPTION OF THE PREFERRED EMBODIMENT

The following description is of the best presently contemplated mode of carrying out the invention. This description is for the purpose of illustrating the general principles of the invention and should not be taken in a limiting sense. The scope of the invention is best determined by the appended claims.

Figure 3:
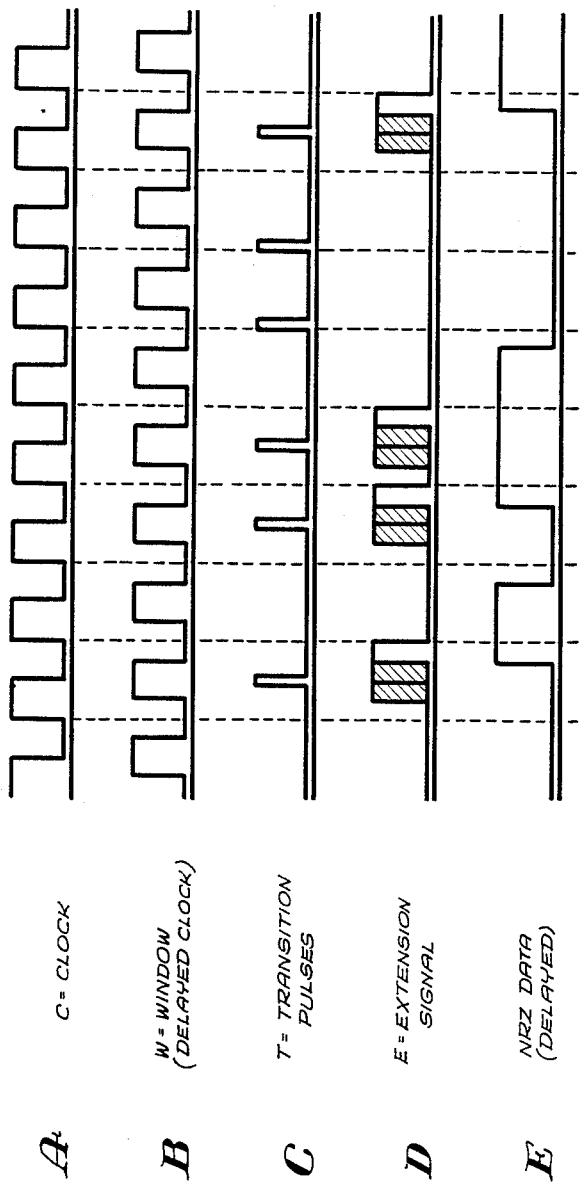
FIG. 3 waveforms A-E illustrating MFM decoding.
Figure 4:
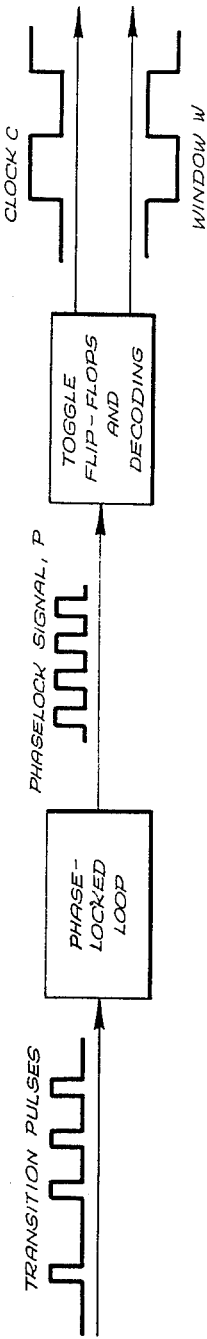
FIG. 4 is a block diagram of a phase-locked loop (PLL) system to recover the clock and generate the window for data separation.
Figure 8:
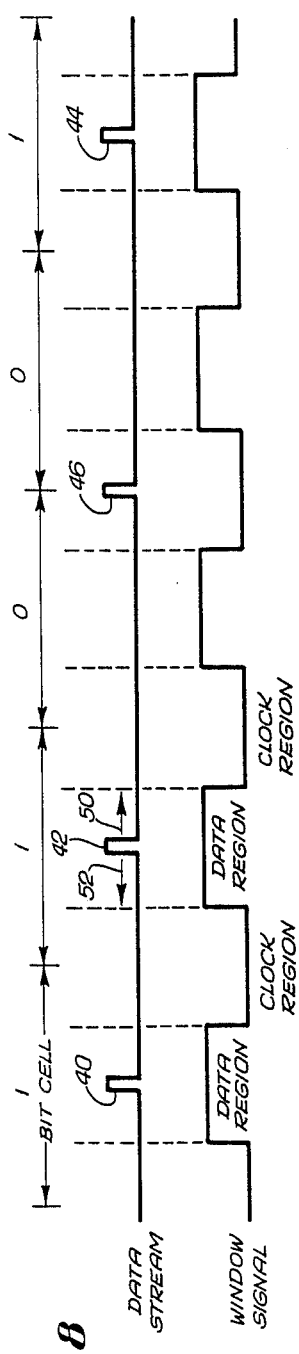
FIG. 8 is an expanded waveform diagram illustrating the relation between a data stream and window signals.

Referring to FIG. 8, a sample data stream of transition pulses representing a data pattern 11001 is illustrated. Transition pulses 40, 42 and 44 occur in the middle of their respective bit cells, while transition pulse 46 occurs at the edge of its bit cell. The function of the phase-locked loop of the digital data separator is to generate a window signal 48 which enables center of bit cell transition pulses to be discriminated from edge of bit cell transition pulses. In an ideal system, each center of bit cell transition pulse will occur in the center of a window. However, the pulses may fall to either side of center as illustrated by arrows 50 and 52 as a result of low frequency data rate variations or high frequency bit jitter. The purpose of the present invention is to provide a data separator having a digital phase-locked loop which will alter the frequency and phase of the window signal in order to track low frequency variations of the data stream but will ignore the effects of high frequency bit jitter on the data stream. By accurately tracking low frequency variations, tolerance to bit jitter will be increased, i.e., the transition pulses will fall within the windows despite a relatively large amount of bit jitter.

Figure 9:
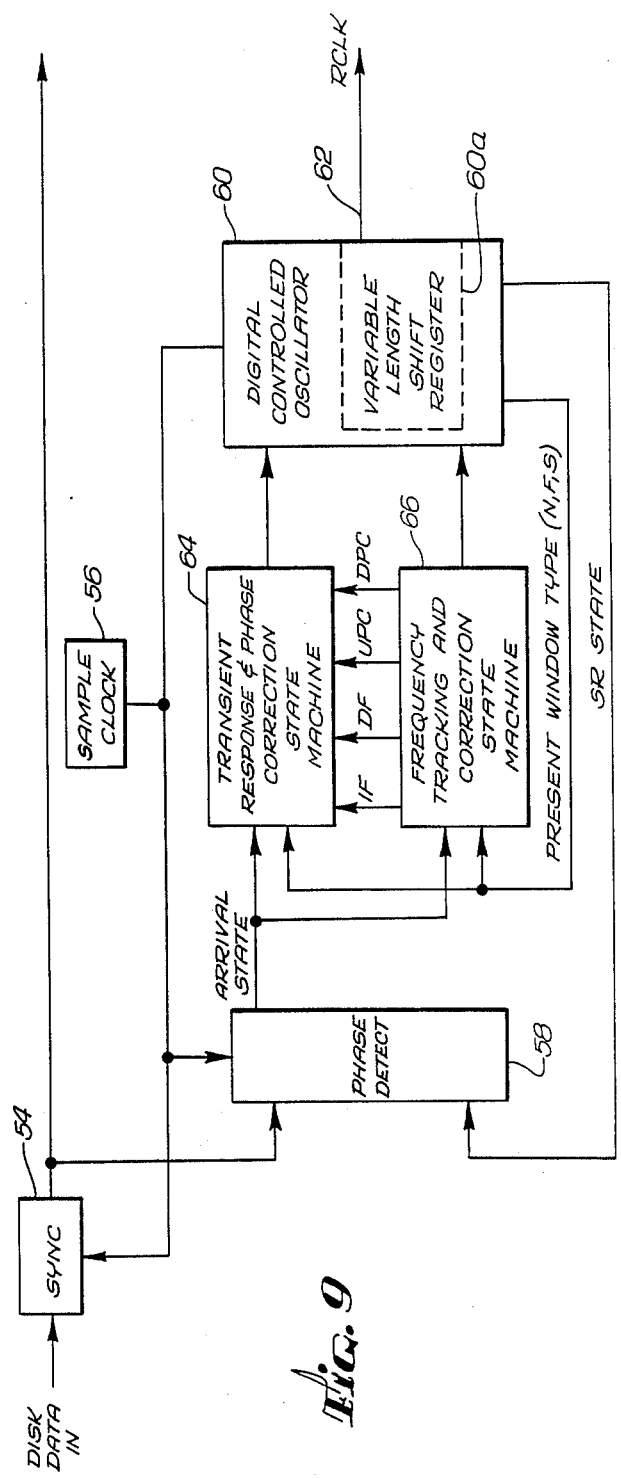
FIG. 9 is a block diagram of the present invention.

FIG. 9 is a functional block diagram of the digital phase-locked loop of the present invention. The system includes three state machines, i.e., sequential logic systems whose outputs depend upon previous and present inputs, and their connections as shown are functional representations. The input to the phase-locked loop portion of the data separator directly from the disk drive contains both MFM clock and data information. The clock is recovered from the input signal to provide a window signal for separation to determine whether a transition pulse falls in a data region or in a clock region. The separator then denotes the position of the transition pulse with respect to the window and adjusts the window according to a specific algorithm. The goal of the algorithm is to keep the pulses close to the center of the window as much as possible (i.e., zero phase error) to allow maximum tolerance to bit jitter. If the transition pulses are always placed in the center of the window, then the recovered clock will run at a fixed rate. However, if the pulses come too soon, then the recovered clock will be adjusted to run faster. Conversely, if the pulses come too slow, the recovered clock will be adjusted to run slower.

The primary components of the phase-locked loop system of the present invention are a phase detector 58, a digital controlled oscillator 60 which is comprised of a variable length shift register 60a having plural segments or "states" and a finite state machine, a transient response and phase correction state machine 64 (hereinafter "phase correction state machine") and a frequency tracking and correction state machine 66 (hereinafter "frequency correction state machine"). The digital controlled oscillator 60 provides a recovered clock, or RCLK, signal on line 62 which is comprised of alternating windows of high and low level. This signal is used in a manner known in the art to separate data from clock signals in the original data stream from the disk drive.

A single "one" is circulated through the shift register and toggles the output signal on line 62 when it reaches the final state of the shift register. The phase of the oscillator is compared to the data input signal by the phase detector 58. The state machines 64 and 66 cause corrections to be made in both the running frequency and phase of the output of the oscillator based upon the detected phase error.

The transition pulses from a disk drive are applied to a sync logic 54 comprised of an asynchronous to synchronous detector which synchronizes the transition pulses with pulses from a sample clock 56. Each synchronized transition pulse from the logic 54 has a pulse width of one sample clock pulse. In the present embodiment of the invention, the digital data separator is used in conjunction with a floppy disk system, and the nominal bit cell rate is 250 kHz. The sample clock 56 is a 32× clock (32 times the bit cell rate), i.e., 8 MHz. A 500 kHz (16 mHz sample clock) CMOS system has also been developed. The synchronized output is applied to the phase detector 58 and compared to the shift register states to determine the relative phase between a transition pulse and the output of the oscillator 60. In the present embodiment of the invention, the phase detector is implemented in discrete logic. However, the phase detection function could alternatively be implemented in software.

The phase detector 58 provides a phase error signal indicating the arrival state of a transition pulse to the phase correction state machine 64 and the frequency correction state machine 66. Based upon the detected state of arrival, i.e, the state in which the "one" circulating in the shift register was in when a transition pulse arrived, the state machines 64 and 66 determine what corrections if any are necessary for the digital controlled oscillator 60. The oscillator is controllable to run at any one of a plurality of preset steady state frequencies, and the frequency correction state machine 66 operates to determine if a change in the preset frequency is required. The phase correction state machine determines if instantaneous phase corrections are necessary, i.e., if one or more states for an individual window must be added or subtracted independent of any changes in the preset frequency.

The operation of the system of FIG. 9 to achieve frequency tracking will be described with reference to FIG. 10. The 32× sample clock is shown in FIG. 10D. The digital controlled oscillator 60 controls the shift register to run at one of thirteen different time-averaged frequencies, with each frequency being achieved by combining windows of fifteen, sixteen and seventeen shift register state duration, illustrated in FIGS. 10A, B and C, respectively. The nominal frequency of the RCLK signal is 250 kHz (the same as the nominal bit cell rate) and is achieved by repeatedly generating "nominal" windows of sixteen state length. The present embodiment of the invention is designed to track frequency variations of up to ±6% from the nominal bit cell rate. Alterations in the time-averaged frequency output of the shift register are achieved in 1% increments. In order to increase the frequency by 6%, the shift register length is altered so that only "fast" windows of fifteen state length are employed. Similarly, when a 6% reduction in frequency is required the shift register is controlled so that only "slow" windows of seventeen state length are employed. The fast and slow windows are shown in FIGS. 10A and 10C, respectively. For frequencies other than the nominal frequency, 6% fast and 6% slow frequencies, two different window types are combined to achieve the desired time-averaged frequency. The combinations of fast, nominal and slow windows to achieve the various output frequencies are shown in Table I as follows:

TABLE I

| Frequency | Repetitive Sequence of Windows |
| --- | --- |
| Nominal (0%): | nominal |
| 1% fast: | fast-nominal-nominal-nominal-nominal-nominal |
| 2% fast: | fast-nominal-nominal |
| 3% fast: | fast-nominal |
| 4% fast: | fast-nominal-fast |
| 5% fast: | fast-nominal-fast-fast-fast-fast |
| 6% fast: | fast |
| 1% slow: | slow-nominal-nominal-nominal-nominal-nominal |
| 2% slow: | slow-nominal-nominal |
| 3% slow: | slow-nominal |
| 4% slow: | slow-nominal-slow |
| 5% slow: | slow-nominal-slow-slow-slow-slow |
| 6% slow: | slow |

By repeating the sequences of windows outlined above, control of the time-averaged frequency can be achieved in 1% increments even though each individual window can only be changed in 6% increments (one state out of sixteen). It should be noted that the ±6% variation and 1% increments are arbitrary and that the greater variation and finer increments could be employed, albeit at the expense of additional hardware. The chosen embodiment provides a satisfactory balance of performance and complexity.

Frequency tracking is achieved by the combination of altering the set frequency of the digital controlled oscillator and by making instantaneous changes in the length of an individual window regardless of the set frequency. The combination of frequency variation and instantaneous changes provides a system having a second order filter function and which is slightly under-damped to provide fast response with minimal ringing.

Changes in the set frequency of the oscillator are initiated in the response to either of two different conditions. As shown in FIG. 10, each window is divided into a "up" region including all states to the left of the center of the window and a "down" region including all states to the right of the center of the window. Since a nominal window includes sixteen states, its center is defined to include two states so that the up region and down region are symmetrical. This is important since symmetrical operation is necessary to achieve linear optimization, i.e., the closest fit to true linear operation in which filter gain changes linearly from the center of a window to the edge of a window.

Figure 14:
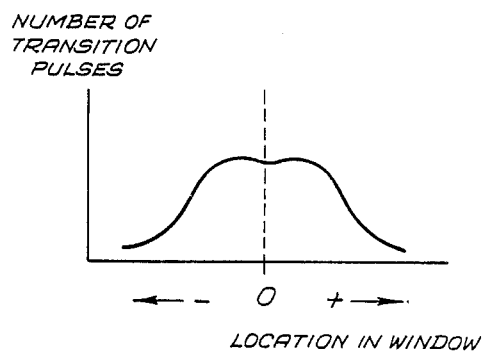
FIG. 14 is a graph illustrating transition pulse distribution within windows for random data.

The frequency correction state machine 66 monitors the occurrence of transition pulses to determine whether they occur in the up region, central region or down region. The occurrence of a single transition pulse in an up region or down region is not necessarily indicative of a frequency error, since the pulse may be off center due to bit jitter. The occurrence of two consecutive pulses in the up region or two consecutive pulses in the down region is a better indication that the error in positioning is due to frequency error rather than bit jitter. However, even two consecutive pulses provides only an approximately 50% probability that a frequency error exists in the direction indicated. This is because errors due to bit jitter will have a generally Gaussian distribution, as indicated in FIG. 14 (with small humps to either side of middle due to peak shift), and the occurrence of two consecutive pulses to either side of the middle of a window may well be as a result of bit jitter as opposed to frequency errors.

In the present invention, the occurrence of transition pulses is monitored and the set frequency of the oscillator is not changed until three consecutive transition pulses occur in an up region or three consecutive transition pulses occur in a down region. By waiting until three consecutive pulses occur in a particular region, the probability that there is an actual frequency error in the direction indicated is greatly increased. The primary drawback in waiting for three consecutive pulses is that if there is indeed a frequency error, the response is relatively slow and a large phase drift may result before the frequency can be corrected. In order to compensate for this lagging operation, one-time phase corrections are made to individual windows to shift the transition pulses back toward the center of the window. If two consecutive transition pulses are detected in the up region or two consecutive transition pulses are detected in the down region, a phase correction is made to the length of the individual window in which the second pulse arrived. The correction in all uses is either the addition or subtraction of one state in the window. A similar phase correction of one state is made upon the detection of three consecutive transition pulses in the up region or three consecutive transition pulses in the down region (in addition to the frequency correction which is made in that event). Not only do these phase corrections to the length of an individual window serve to shift the phase of the recovered clock signal to compensate for drift due to lagging frequency correction, it also serves to further increase the probability that any changes in the set frequency will be in the proper direction since subsequent transition pulses will also be phase shifted toward the center of the window. In effect, the phase correction slows the slew rate of the frequency correction function.

Figure 15:
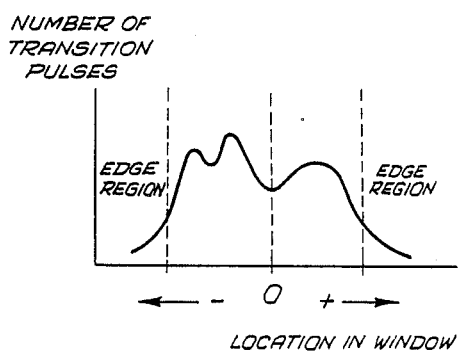
FIG. 15 is a graph illustrating transition pulse distribution for signals of specific data content typically encountered in disk drive system.

The frequency and phase corrections provided as discussed above are extremely effective in tracking actual frequency variations. However, filtering errors remain due to the fact that the bit jitter in an actual system with certain commonly encountered data patterns is not equally distributed as illustrated in FIG. 14. Instead, there is a pattern dependency, i.e., in an actual system some of the data patterns encountered are such that the bit jitter will be nonsymmetrically illustrated in FIG. 15. As a result, some frequency drifts may not be accurately detected by the monitoring of the up region and down region. In order to compensate for this, additional filtering is accomplished by monitoring edge regions at the outside edges of each window. These edge regions are indicated in FIG. 10. After each change in frequency, the total number of transition pulses occurring in either edge region (whether or not they are consecutive) is monitored. If the total exceeds a predetermined level, a frequency correction is then made. In the present embodiment, if three pulses occur in an individual edge region since the previous change in frequency, it is taken as an indication that there is a frequency error, and the set frequency is changed. As can be seen in FIG. 15, the number of transition pulses occurring in the edge regions is substantially symmetrical, and therefore is not affected by the nonsymmetrical pattern dependency between the edge regions.

Although the filter function achieved by monitoring the edge regions has a higher gain than that of the up and down regions since it is not limited to consecutive occurrences, its effect is reduced since it is limited to transition pulses occurring very near to the edges of the windows. By controlling frequency changes based upon the occurrence of transition pulses in the edge regions and up and down regions, very accurate frequency tracking can be achieved despite pattern dependent bit jitter. The frequency corrections are accomplished in conjunction with instantaneous phase corrections to provide fast response but avoid frequency changes in the wrong direction.

In addition to the frequency and phase corrections discussed above, the present invention operates to make additional phase corrections to an individual window as a function of the occurrence of a transition pulse relative to the states of the shift register. If a transition pulse arrives toward the center of a window, there is a greater likelihood that the shift is due to bit jitter rather than to frequency error. In order to filter out this bit jitter, phase corrections are made to an individual window without affecting the set frequency. The correction weights associated with the changes in window length are shown in FIG. 10. For example, if a window is a nominal window and a transition pulse arrives in window state five, two states will be added to that window. Similarly, if the transition pulse was detected as occurring in state B, one state would be subtracted from that window. These phase corrections serve to maintain phase lock and control the slew rate of the frequency corrections. Although accomplished independent from frequency corrections, they serve to affect the frequency corrections since they affect the position of subsequent transition pulses.

Figure 10:
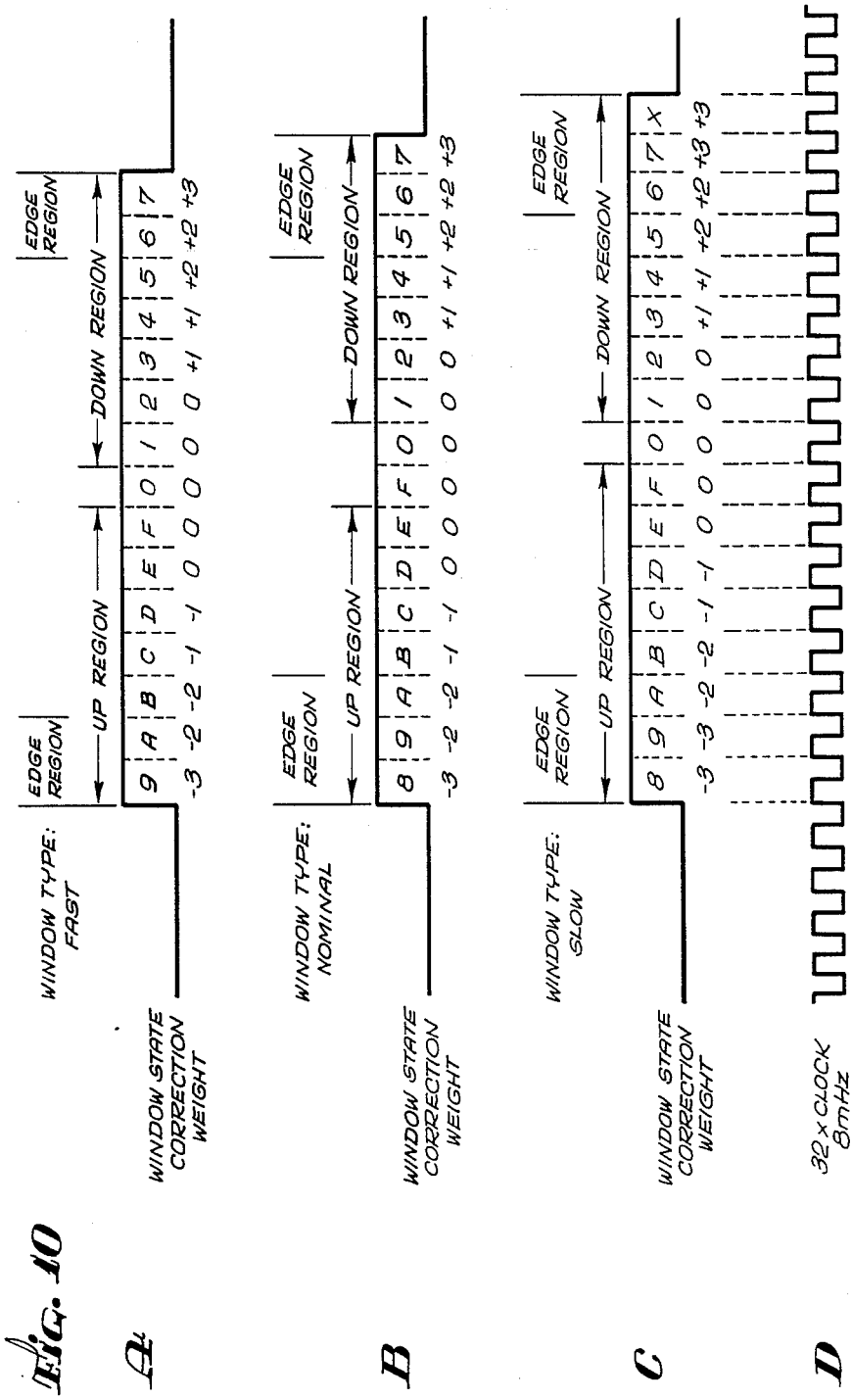
FIG. 10 diagrams A–D of the sample clock are various windows employed in the present invention.

It can be seen from the region divisions and weightings given in FIG. 10 that the operation of the system of the present invention is completely symmetrical, i.e., all regions and weightings to either side of the defined middle of a window are equal. This feature is very important in achieving linear filtering operation since it assures that filter gain is symmetrical about the center of each window.

Figure 11A:
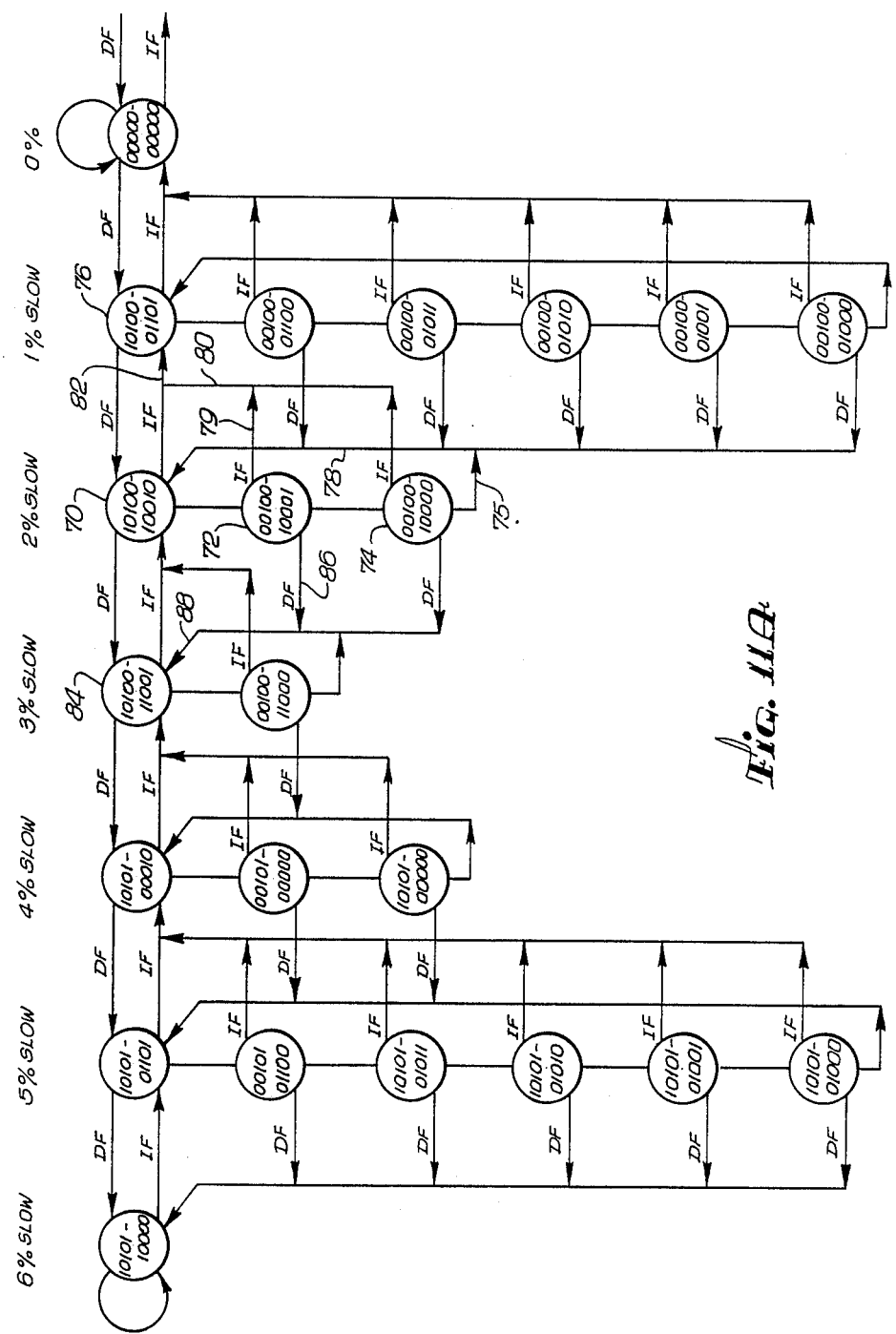
FIGS. 11A and 11B form a state diagram of the digital controlled oscillator of the present invention illustrating various preset operating frequencies.
Figure 11B:
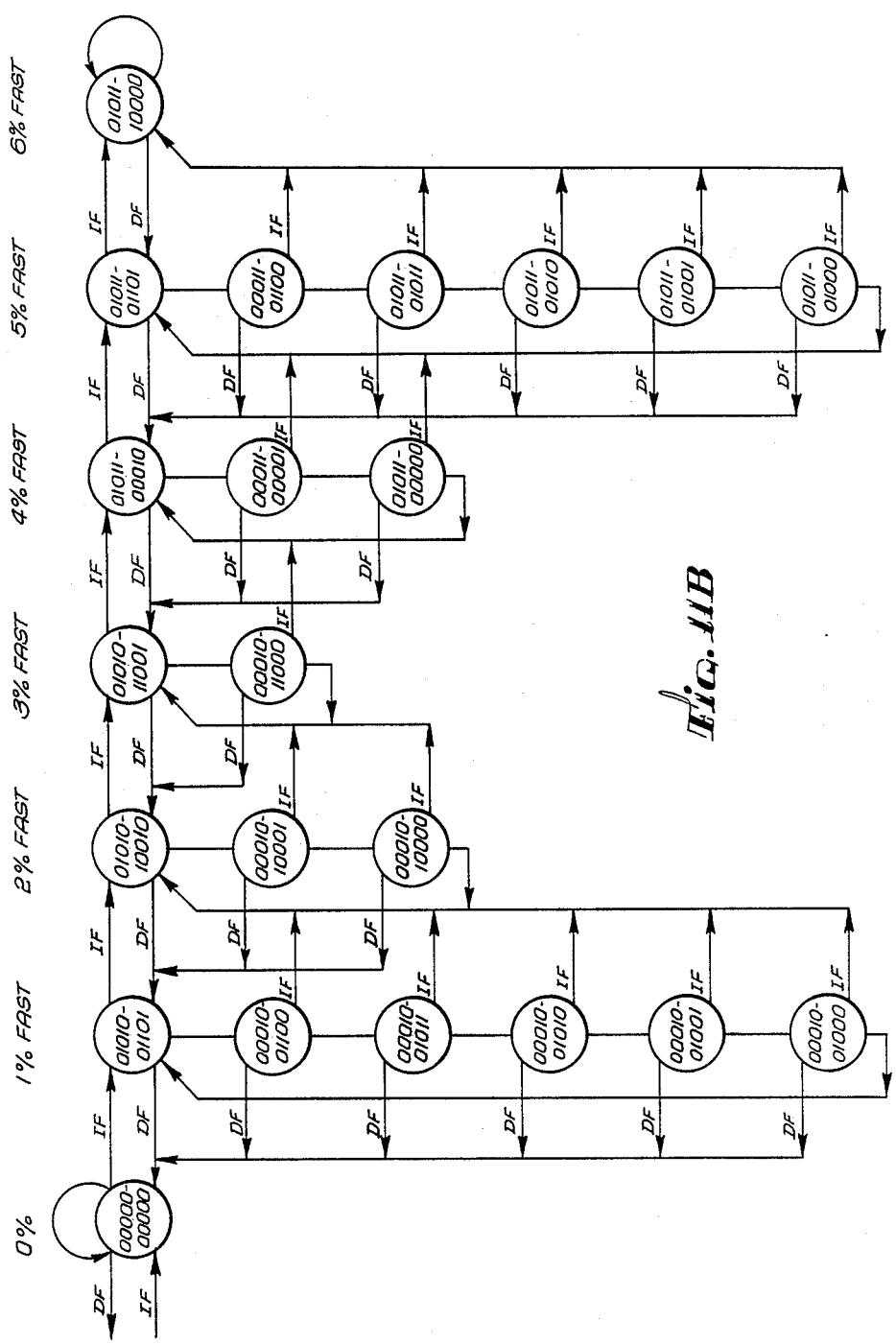

Specific operations of the digital controlled oscillator 60, phase correction state machine 64 and frequency correction state machine 66 will be described with reference to FIGS. 11-13. FIG. 11 is a state diagram showing the operation of the digital controlled oscillator 60 to achieve various preset frequencies. Each circle represents a window. Contained within the circle is a unique bit pattern containing four items of information which describe the window. The first two bits represent the present window type (nominal, fast or slow), the second two bits represent the frequency type (nominal, fast or slow to indicate whether a frequency higher or lower than the nominal frequency is called for) and the next three bits represent a frequency indicating the magnitude of the preset frequency (0, 1, 2, 3, 4, 5 or 6%). The last three bits of the bit pattern represent the value of an internal down counter in the state machine of the digital controlled oscillator 60 which indicates the present location within a sequence of windows. This counter is preset to the total number of windows in a sequence at the first window of each sequence. The bit designations are shown in Table II as follows:

TABLE II

| | Frequency Type |
|---|---|
| 00 | nominal |
| 01 | fast |
| 10 | slow |
| | Frequency Pointer |
| 000 | 0% |
| 001 | 1% |
| 010 | 2% |
| 011 | 3% |
| 100 | 4% |
| 101 | 5% |
| 110 | 6% |
| | Present Window Type |
| 00 | nominal |
| 01 | fast |
| 10 | slow |

Arrows between the circles indicate steps from ne window to the next depending upon required changes determined by the frequency correction state machine. If no changes are necessary, windows will be generated along a vertical sequence to achieve the desired time-averaged frequency output for the digital controlled oscillator. The internal down counter is decremented during this sequence, with the last window in each vertical sequence having a counter value of zero. For example, to operate continuously at a 2% slow frequency the windows indicated in circles 70, 72 and 74 would be generated consecutively and would then repeat following the path indicated by arrows 75 and 78. This cycle will continue as long as no change is required in the set frequency. If the frequency correction state machine 66 determines during a particular window that a frequency correction is necessary, the sequence will be interrupted and the next window will be the first window of the adjacent sequence. For example, if during the window represented in circle 72 the frequency correction state machine determines that an increase in frequency is necessary, the next window will not be that indicated by circle 74 but instead will be that indicated by circle 76 connected along a route indicated by arrows 79, 80 and 82. Similarly, if a decrease in frequency is called for the next window will be that indicated in circle 84 and connected to circle 72 via arrows 86 and 88. Arrows calling for an increase in frequency are labeled IF and arrows calling for a decrease in frequency are labeled DF in FIGS. 11A and 11B.

The operation of the frequency correction state machine 66 will be described with reference to FIGS. 12A and 12B which together form the flow chart for the state machine 66. The flow chart illustrates the implementation to achieve the frequency control operation described previously with respect to FIG. 10. The frequency correction state machine 66 includes six internal counters. A first counter is a consecutive increment frequency counter which keeps track of consecutive transition pulses occurring in the up region of windows. A second counter is a consecutive decrement frequency counter which keeps track of consecutive transition pulses occurring in the down region of windows. A third counter is an accumulative increment frequency counter which keeps track of the total number of transition pulses occurring in the edge region which overlaps the up region since the last change in frequency. Similarly, an accumulative decrement frequency counter keeps track of the total number of transition pulses occurring in the edge region which overlaps the down region since the previous change in frequency. The contents of these four counters are monitored to determine if changes in the set frequency are necessary. The counters are reset upon each frequency change.

In addition to the frequency counters, the state machine 66 includes an up phase correction counter which also keeps track of consecutive pulses in the up region to determine if a phase correction is necessary and a down phase correction counter which keeps track of consecutive transition pulses in the down region to determine if a phase correction is necessary.

Figure 12B:
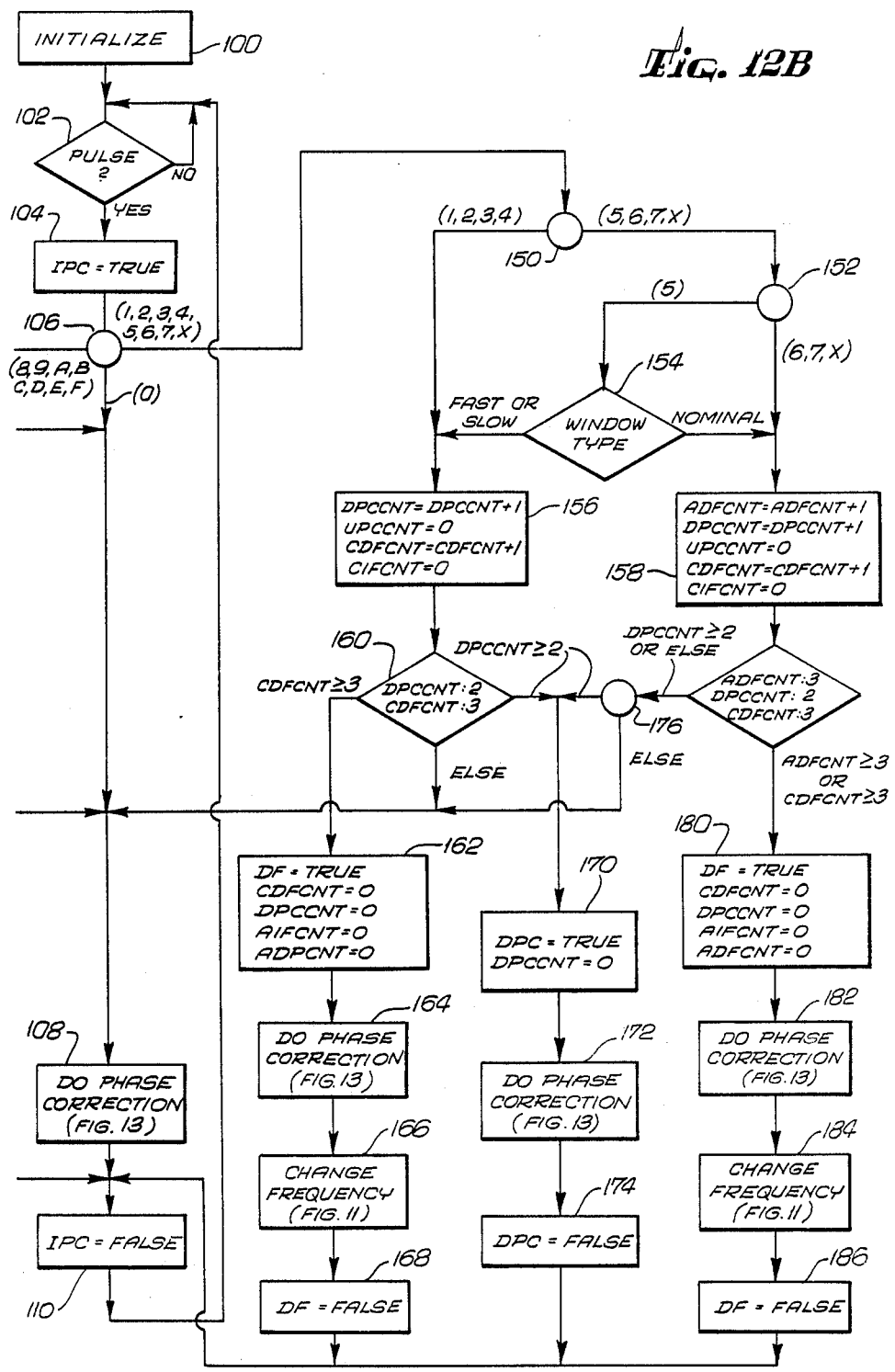

FIGS. 12A and 12B both show the central portion of the overall flow chart of the state machine including an Initialize step 100 and various steps indicated directly below the step 100. Flow chart steps relating to transition pulses occurring in window state zero or window states in the up region are shown in FIG. 12A, and flow chart steps for transition pulses occurring in window state zero or window states in the down region are shown in FIG. 12B. Variables shown in the figures have the descriptions indicated below in Table III:

TABLE III

| | Variable Description |
|---|---|
| IF: | increment frequency (true or false) |
| DF: | decrement frequency (true or false) |
| UPC: | up phase correction (true or false) |
| DPC: | down phase correction (true or false) |
| IPC: | instantaneous phase correction (true or false) |
| CIFCNT: | consecutive increment frequency counter (integer) |
| AIFCNT: | accumulative increment frequency counter (integer) |
| CDFCNT: | consecutive decrement frequency counter (integer) |
| ADFCNT: | accumulative decrement frequency counter (integer) |
| UPCCNT: | up phase correction counter (integer) |
| DPCCNT: | down phase correction counter (integer) |
| WT: | window type (nominal, fast or slow) |

In the Initialize step, step 100, all counters are set to zero, the variables IF, DF, UPC, DPC and IPC are set false and the variable WT is set to nominal. This initialization step occurs upon start up of the phase-locked loop system. The next step is a pulse step, step 102, in which it is determined if a transition pulse has arrived. Once the transition pulse arrives, IPC is set to true, step 104, to enable (but not execute) subsequent phase corrections. A determination is then made as to the window state in which the transition pulse arrived, step 106. If the transition pulse arrived in state zero (as shown in FIG. 10) no frequency corrections will be made. In this case, the next step is the phase correction step, step 108, in which any necessary phase corrections called for by the arrival position of the current pulse without regard to previous pulses are made as will be described subsequently with respect to FIG. 13. After the phase correction is made, IPC is set to false, step 110, and the machine returns to step 102 to determine the presence of a subsequent transition pulse.

If a transition pulse is detected at step 106 in states 8, 9, A, B, C, E or F, a determination is then made as to whether the pulse occurred in one of states 8, 9 or A or in one of states B, C, D, E or F, step 112. If the pulse occurred in states B, C, D, E or F, a further determination is made to determine if the pulse occurred in state F, step 114. If so, the window type is checked to see if it is nominal, step 116. If so, state F is considered to be in the center region (FIG. 10B). The machine in this case would branch back to step 108. However, if the window type is fast or slow a tranition pulse occurring in state F is in the up region and therefore will be treated the same as a transition pulses occurring in states B, C, D or E. In this case, the down phase counter and consecutive decrement frequency counter are reset (since consecutive transition pulses will not have occurred in the down region), whereas the up phase counter and consecutive increment frequency counter are incremented, step 118. The contents of the up phase counter and consecutive increment frequency counter are then compared to two and three respectively, step 120. If the contents of the up phase counter are greater or equal to two, a phase correction is required. Thus, the up phase correction flag is set to true and the up phase counter reset, step 122. The phase correction is then done, step 124, (including additional phase corrections which may be called for by the phase correction state machine 66) and the up phase correction flag is then set to false, step 126. The machine then returns to step 110.

If the consecutive increment frequency counter contents are greater than or equal to three at step 120, a change in frequency is required and the increment frequency flag is set to true, step 128. All of the frequency counters are also reset to zero in this step. A phase correction is then accomplished (of one state due to the counter contents being equal to three and any additional states due to the arrival state of the transition pulse in the current window), step 130, and the frequency is then incremented, step 132. The incrementing of frequency is accomplished as described previously with respect to FIG. 11. The increment frequency flag is then set to false, step 134, and the machine returns to step 110.

If the conditions at step 120 are not met for either a phase or frequency correction, the machine returns to step 108 to do any necessary phase correction called for by the phase correction state machine 64.

If a transition pulse occurs in states 8, 9 or A, i.e., an edge region, there is an effect both upon the consecutive increment frequency counter and the accumulative frequency counter. Therefore, from step 112 the machine goes to step 136. In this step, the down phase and down consecutive count correction counters are reset whereas the accumulative increment frequency counter, consecutive increment frequency counter and up phase correction counter are all incremented by one. The contents of the accumulative increment frequency counter and consecutive frequency counter are then compared to three and the contents of the up phase correction counter are compared to two, step 138. If the contents of either the accumulative increment frequency counter or consecutive increment frequency counter are greater than or equal to three, frequency and phase corrections are necessary and the increment frequency flag is therefore set to true, step 140. The counters are also reset in this step. The necessary phase correction is then accomplished, step 142, followed by an increment in frequency, step 144. The increment frequency flag is then set to false, step 146, and the machine returns to step 110.

If the accumulative increment frequency counter and consecutive increment frequency counter contents are less than three, a determination is made as to whether the value of the up phase counter is greater than or equal to two, step 148. If so, a phase correction is necessary and the machine branches to step 122 to set the up phase correction flag true prior to doing phase corrections at step 124. If not, the machine branches to step 108 to do any necessary phase corrections depending upon the arrival state of the transition pulse in that particular window but independent of the arrival state of a transition pulse in previous windows.

Thus, the flow chart of FIG. 12A shows how the phase and frequency corrections are made in response to the detection of consecutive transition pulses in the up region and the detection of the total number of transition pulses in the edge region since the previous change in frequency. It should be noted that although phase corrections may not be necessary in a window based upon the contents of the phase corrections counters, a phase correction may be necessary due to the arrival of a pulse in a state having a non-zero correction weight (FIG. 10), which is why the phase correction step 108 is included.

The decrementing of the set frequency and associated phase corrections are accomplished in accordance with the steps shown in FIG. 12B. Arrival in state 5 is handled similarly to arrival in state F, since this state may or may not be in an edge region depending upon the window type. Steps 150, 152 and 154 therefore function to determine if a transition pulse arrived in only the down region or in both the down region and the edge region. If arrival is only in the down region, the machine goes to step 156, whereas if the arrival is in a down region and an edge region the machine does to step 158. Subsequent steps correspond directly to steps shown in FIG. 12A. Thus, steps 160, 162, 164, 166 and 168 correspond to steps 120, 128, 130, 132 and 134, respectively. Steps 170, 172 and 174 correspond to steps 122, 124 and 126, respectively. Step 176 corresponds to step 148, and steps 178, 180, 182, 184 and 186 correspond to steps 138, 140, 142, 144 and 146, respectively.

Figure 13A:
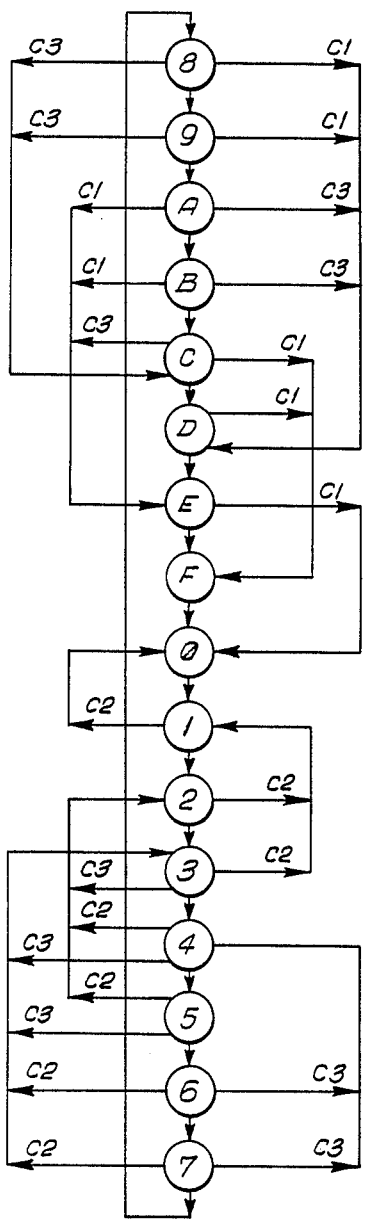
FIGS. 13A–C are state diagrams for the transient response and phase correction state machine of the invention, illustrating phase corrections applied to three different windows used to generate preset frequencies.
Figure 13B:
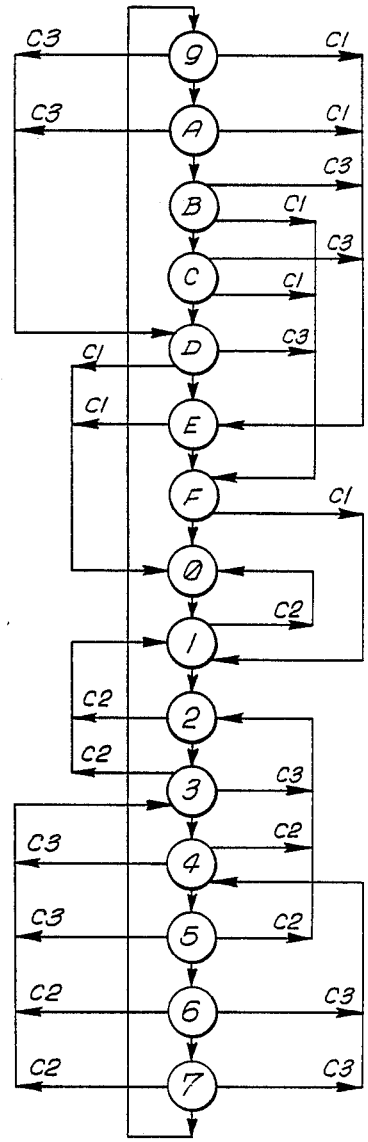
Figure 13C:
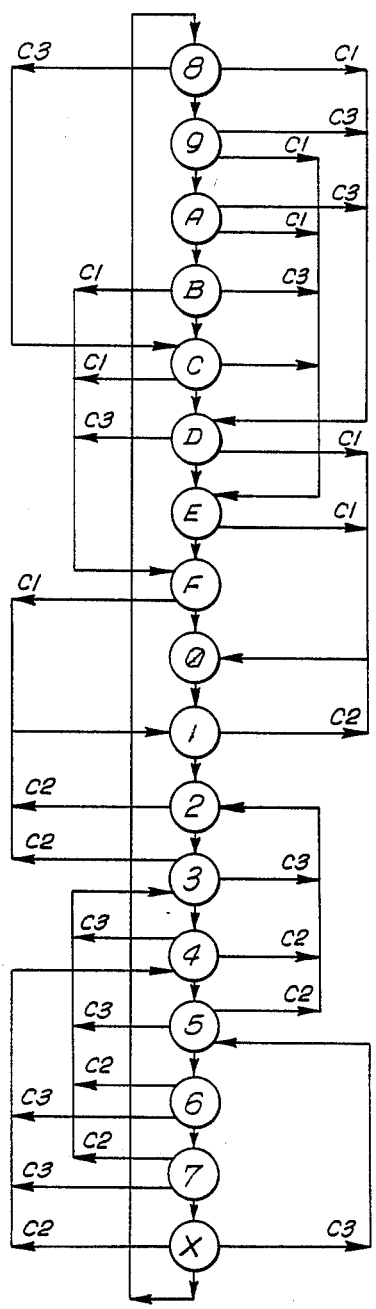

The individual window phase corrections are accomplished in accordance with the state diagrams shown in FIGS. 13A, 13B and 13C. These diagrams are for nominal, fast and slow windows, respectively. The phase correction state machine 64 shown in FIG. 9 makes corrections to the length of an individual window based upon the arrival state of a transition pulse in that window and based upon determinations made by the frequency correction state machine 66 as described above with respect to FIG. 12. FIGS. 13A, 13B and 13C illustrate the individual states of the shift register of the digital controlled oscillator, with condition arrows indicating how phase corrections are made by adding or subtracting states from a window. If no phase corrections are required, the "one" will progress through the states of the shift register in consecutive fashion. However, if any one of various conditions exist calling for a phase correction, the one will be caused to skip states in either a forward or reverse direction so as to effectively increase or decrease the length of the shift register and thus the length of the individual window. Three different conditions can affect the window length. Condition 1 (C1) corresponds to the variables IF (increment frequency) or UPC (up phase correction) supplied by the frequency correction state machine 66 being true. This condition calls for the shortening in the length of a window. Condition 2 corresponds to either of the variables DF (decrement frequency) or DPC (down phase correction) from the frequency correction state machine 66 being true. This condition calls for a lengthening of a window. Conditions 1 and 2 incorporate both the single state subtraction or addition of a window called for by the frequency correction state machine as well as additional phase corrections in accordance with the weightings shown in FIG. 10.

Condition 3 (C3) corresponds to the variable IPC (instantaneous phase correction) being true and enables phase corrections based upon arrival state in single window to be made in accordance with the correction weights indicated in FIG. 10. This condition can therefore result in either a lengthening or shortening of a window. This condition exists when no phase change is called for by the frequency correction state machine counters. For example, in FIG. 13A if a transition pulse occurs in state 9 and only condition 3 is true, subsequent states A and B will be skipped and the next state of the shift register will be state C. However, if condition 1 is also true it will override condition 3 and states A, B and C will be skipped and the next state will be state D. In either case, the length of the window will be shortened. Similarly, if the transition pulse occurs in state 3 and condition 3 is true the shift register will move back to state 2 to effectively lengthen the window. If condition 2 is also true, an additional two states will be added to the window. Thus, the conditions 1 and 2 call for one additional state phase correction as compared to condition 3. The overall result is that any individual window can have a length varying between eleven and twenty one states.

All of the calculations of the state machines are accomplished in real time. Since in the present embodiment some calculations may take longer than the time of a single shift register state, offset arithmetic is employed so that the "one" in the shift register is in the proper state at the end of a calculation. For example, assuming that it takes four shift register states to do the necessary calculations to determine if any phase corrections are necessary, the "one" is frozen in the arrival state and four states are skipped after the calculation is completed in order to compensate for the calculation time. Of course, such offset arithmetic is not necessary if the state machines are configured to be fast enough such that calculations can all be done within one state of the shift register.

Although a specific algorithm has been described for determining frequency and phase corrections to achieve zero phase error, the various operations are all interrelated. Thus, many different weightings, consecutive counter quotas, accumulative counter quotas, region definitions, etc. could be employed and still achieve proper filter operation, so long as the interrelationship between the different factors is properly determined. In any algorithm which is developed, however, frequency changes are made only in response to the monitoring of a minimum of three transition pulses (regardless of whether changes are conditioned upon consecutive or accumulative occurrences in predetermined regions) so as to ensure that frequency changes in the wrong direction are not made. To compensate for the lagging operation inherent in waiting a minimum of three pulses before making any frequency changes, phase changes are made based upon a history of at least two consecutive transition pulses. By controlling frequency and phase changes in this fashion, extremely accurate digital phase-locked loop operation can be achieved.

What is claimed is:

1. A digital phase-locked loop system for providing a digital output signal synchronized with a stream of data pulses, comprising:
    variable oscillator means for generating a digital output signal comprises of alternating high and low level pulse windows in which each window is comprised of a plurality of successive segments of equal duration, wherein the oscillator means is alterable to control the number of segments in each window in a sequence of windows to provide one of a plurality of predetermined set output frequencies;
    phase detection means for determining the position of each data pulse relative to the segments of a window in which it occurs; and
    processing means, responsive to the phase detection means, for controlling the oscillator means to (a) alter the set output frequency as a function of the positions of a minimum of three consecutive data pulses with respect to the segments of the windows in which they occur and (b) alter the number of segments in an individual window as a function of the position of a data pulse with respect to the segments of said individual window and as a function of the positions of a minimum of two data pulses with respect to the segments of windows in which they occur.

2. A digital phase-locked loop system as in claim 1, wherein each window is divided into an up region of contiguous segments and a down region of contiguous segments, wherein the processor means alters the set frequency upward if said at least three consecutive data pulses occur in the up region and downward if said at least three consecutive data pulses occur in the down region.

3. A digital phase-locked loop system as in claim 2 wherein each window includes a center region of at least one segment which separates the up region from the down region and wherein the up region and down region have an equal number of segments.

4. A digital phase-locked loop system as in claim 2, wherein the up region includes a first edge region including a predetermined number of segments at one end of the window and the down region includes a second edge region including a predetermined number of segments at the other end of the window, wherein the processing means alters the set frequency upward if the total number of data pulses occurring in the first edge region since the last alteration of set frequency exceeds a predetermined plural number and alters the set frequency downward if the total number of data pulses occurring in the second edge region exceeds said predetermined plural number.

5. A digital phase-locked loop system as in claim 1, wherein the processing means includes means for altering the set output frequency as a function of the positions of a plurality of data pulses with respect to the segments of windows in which they occur, said plurality of data pulses occuring after the most recent alteration of the set frequency.

6. A digital phase-locked loop system as in claim 5 wherein the means for altering alters the set output frequency if the number of data pulses occurring in a predetermined group of segments since the most recent alteration exceeds a predetermined total.

7. A digital phase-locked loop system as in claim 1 wherein the variable oscillator means includes a variable length shift register having a plurality of states, wherein each state corresponds to a segment and wherein the number of states determines the duration of a window.

8. A digital phase-locked loop system as in claim 1 wherein each segment has a weighting associated with it, wherein the weightings increase from the center of a window to the edge of a window, wherein the processor means controls the oscillator means such that when a data pulse occurs in a segment which has a non-zero weighting and is prior to the center of the window at least one segment will be subtracted from that window and when a data pulse occurs in a segment which has a non-zero weighting and is after the center of the window at least one segment will be added to that window.

9. A digital phase-locked loop system as in claim 8 wherein each window is divided into an up region of contiguous segments and a down region of contiguous segments, wherein when consecutive data pulses occur in the up region the processing means reduces the number of segments in the window in which the latest data pulse occurred and when consecutive data pulses occur in the down region the processing means increases the number of segments in the window in which the latest data pulse occurred.

10. A digital phase-locked loop system for providing a digital output signal synchronized with a stream of data pulses, comprising:
    variable oscillator means for generating a digital output signal comprised of alternating high and low level pulse windows in which each window is comprised of a plurality of successive segments of known duration, wherein the oscillator means is alterable to control the number of segments in each window;
    phase detection means for determining the position of each data pulse relative to the segments of a window in which it occurs;
    processing means, responsive to the phase detection means, for controlling the oscillator means to control the number of segments in each window, said processing means including:
    (a) frequency control means for causing the oscillator means to provide windows of controlled length to achieve a predetermined set output frequency and for altering the set output frequency as a function of the positions at least three consecutive data pulses with respect to the windows in which they occur and as a function of the positions of at least two data pulses since the previous alteration of set output frequency with respect to the windows in which they occur; and (b) phase control means for altering the number of segments in an individual window as a function of the position of a data pulse with respect to the individual windows in which it occurs and as a function of the position of at least one preceding data pulse with respect to the window in which it occurs.

11. A digital phase-locked loop system as in claim 10 wherein each window is comprised of a center portion of at least one segment, an up region of contiguous segments to one side of the center portion and a down region of contiguous segments to the other side of the center portion, wherein the frequency control means alters the set output frequency upward if three consecutive data pulses occur in the up region and downward if three consecutive data pulses occur in the down region.

12. A digital phase-locked loop system as in claim 11 wherein the up region includes a first edge region including a predetermined number of segments at one end of the window and the down region includes a predetermined number of segments at the other end of the window, wherein the frequency control means alters the set output frequency upward if the number of data pulses occurring in the first edge region since the previous alteration equals three and alters the set output frequency downward if the number of data pulses occurring in the second edge region since the previous alteration of the set output frequency equals three.

13. A digital phase-locked loop system as in claim 12 wherein each segment has a weighting associated with it, wherein the weightings increase in magnitude from the center of a window to the edge of a window, wherein the phase control means causes at least one segment to be subtracted from a window when a data pulse occurs in a segment of the window prior to the center and having a non-zero weighting and causes at least one segment to be added from a window when a data pulse occurs in a segment of the window after the center and having a non-zero weighting.

14. A digital phase-locked loop system as in claim 13 wherein the phase control means causes at least one segment to be subtracted from a window when at least two consecutive data pulses occur in the up region of the windows and caused at least one segment to be added to a window when at least two consecutive data pulses occur in the down region of their windows.

15. A system for reconstructing timing windows of an asynchronous series of supplied data pulses where the data pulses may be subject to short term bit jitter, long term frequency drifts and long term/short term phase shifts comprising:

oscillator means for generating digital timing windows of variable duration wherein the duration of each timing window is divided into a plurality of time segments to define in each timing window a central region, an up region, a down region, an upper edge region and a lower edge region, the central region being timewise disposed between the up and down regions, the upper and lower edge regions being respectively disposed at extreme edge portions of the up and down regions;

phase detection means, coupled to receive the generated digital timing and the supplied data pulses, for detecting the timing position of each arriving data pulse relative to a correspondingly generated timing window, wherein the phase detection means has a first detection state that indicates a consecutive series of at least three data pulses arriving in a same one of the up and down regions of their respective timing windows;

frequency setting means, responsive to the phase detection means, for establishing a long term pattern of durations for the variable duration timing windows of the oscillator means to thereby set a long term frequency for the timing windows, the frequency setting means including frequency shifting means, responsive to the first detection state of the phase detection means, for shifting the long term frequency of the timing windows to thereby track long term frequency drifts of the supplied data pulses; and phase adjusting means, responsive to the timing position of individual ones of the data pulses as detected by the phase detection means, for changing in a short term the duration of corresponding individual ones of the timing windows to thereby track short term phase shifts of the supplied data pulses.

16. A system according to claim 15 wherein the phase detection means has a second detection state that indicates a consecutive series of at least two data pulses arriving in a same one of the up and down regions of their repsective timing windows, and wherein the phase adjusting means includes a phase correction means, responsive to the second detection state, for correcting the length of individual ones of the timing windows.

17. A system according to claim 16 wherein the frequency setting means includes an edge monitoring means for monitoring the upper and lower edge regions of each timing window and shifting the long term frequency when the total number of data pulses in one or the other of the upper and lower edge regions, since a previous shifting of the long term frequency, exceeds a predetermined number.

18. A system according to claim 15 wherein the phase adjusting means includes weighting means for assigning correction weights to the time segments of each timing window, the correction weights determining the amount if any by which the individual ones of the timing windows are to be changed, wherein the correction weights of the weighting means increase in absolute value from the central region towards the upper and lower edge regions, and wherein phase corrections are made to individual timing windows as a function of the correction weights assigned to the time segments of corresponding individual ones of the arriving data pulses.

* * * * *